(12) United States Patent
Siaud et al.

(10) Patent No.: US 8,194,527 B2
(45) Date of Patent: Jun. 5, 2012

(54) INTERLEAVING WITH ITERATIVE CALCULATION OF INTERLEAVING ADDRESSES

(75) Inventors: Isabelle Siaud, Rennes (FR); Anne-Marie Ulmer-Moll, Rennes (FR)

(73) Assignee: France Telecom, Paris (FR)

( * ) Notice: Subject to any disclaimer, the term of this patent is extended or adjusted under 35 U.S.C. 154(b) by 596 days.

(21) Appl. No.: 11/794,788

(22) PCT Filed: Dec. 19, 2005

(86) PCT No.: PCT/FR2005/003237
§ 371 (c)(1),
(2), (4) Date: Jul. 8, 2009

(87) PCT Pub. No.: WO2006/072694
PCT Pub. Date: Jul. 13, 2006

(65) Prior Publication Data
US 2010/0008214 A1 Jan. 14, 2010

(30) Foreign Application Priority Data
Dec. 31, 2004 (FR) ...................................... 04 14113

(51) Int. Cl.
*H04J 11/00* (2006.01)
(52) U.S. Cl. ........ 370/203; 370/343; 714/702; 714/786; 375/265; 341/81
(58) Field of Classification Search .......... 370/203–210, 370/343, 310; 375/260, 265; 714/701, 755, 714/776, 702, 786; 341/81
See application file for complete search history.

(56) References Cited

U.S. PATENT DOCUMENTS

| | | | |
|---|---|---|---|
| 3,652,998 A | 3/1972 | Forney, Jr. | |
| 6,014,761 A * | 1/2000 | Lachish et al. | 714/702 |
| 6,278,685 B1 * | 8/2001 | Yonge et al. | 370/203 |
| 6,339,834 B1 | 1/2002 | Crozier et al. | |
| 6,442,728 B1 * | 8/2002 | Cui et al. | 714/786 |

(Continued)

FOREIGN PATENT DOCUMENTS

GB          2400776          * 10/2004

OTHER PUBLICATIONS

Crozier et al., "High-performance low-memory interleaver for turbo-codes", VTC Fall 2001, IEEE 54$^{th}$ Vehicular Technology Conference Proceedings, vol. 1 of 4, pp. 2394-2398, Oct. 7, 2001.

*Primary Examiner* — Kwang B Yao
*Assistant Examiner* — Vincelas Louis
(74) *Attorney, Agent, or Firm* — Cozen O'Connor (57) ABSTRACT

A method and a device (4) for block interleaving of size K with N iterations of index j, N being greater than or equal to 1, of input digital data items indexed by a variable k= $\{0, \ldots, K-1\}$. The interleaving method uses a turbo structure that has two inputs and one output. At the end of each iteration j, the interleaving law $I^{(j)}(k)$ at the output of the interleaver (4) is modified in accordance with an input sequence formed by the position indices of the data items before interleaving (typically a ramp) and in accordance with an interleaved sequence (which provides the position of the data items after interleaving) resulting from the previous iteration of the same interleaving algorithm.

19 Claims, 3 Drawing Sheets

U.S. PATENT DOCUMENTS

| | | | |
|---|---|---|---|
| 6,701,467 B1* | 3/2004 | Victor | 714/701 |
| 6,704,366 B1* | 3/2004 | Combes et al. | 375/260 |
| 6,745,362 B1* | 6/2004 | Carlach et al. | 714/755 |
| 7,376,117 B2* | 5/2008 | Erlich et al. | 370/343 |
| 7,535,860 B2* | 5/2009 | Park et al. | 370/310 |
| 2002/0194554 A1* | 12/2002 | Ferrari et al. | 714/701 |
| 2004/0022179 A1* | 2/2004 | Giannakis et al. | 370/207 |
| 2006/0039273 A1* | 2/2006 | Gore et al. | 370/208 |
| 2008/0253279 A1* | 10/2008 | Ma et al. | 370/206 |
| 2009/0285320 A1* | 11/2009 | Cameron et al. | 375/265 |
| 2010/0033355 A1* | 2/2010 | Dinoi et al. | 341/81 |
| 2010/0205510 A1* | 8/2010 | von der Embse | 714/776 |

\* cited by examiner

INTERLEAVING WITH ITERATIVE CALCULATION OF INTERLEAVING ADDRESSES

RELATED APPLICATIONS

This is a U.S. National Phase Application under 35 USC 371 of International Application PCT/FR2005/003237 filed on Dec. 19, 2005.

FIELD OF THE INVENTION

The present invention relates to the field of telecommunications. Within that field, the invention relates more particularly to digital communications, which include both cable communications and wireless communications in which the transmission channel is a radio channel.

The invention is concerned with interleaving techniques, which are generally used to reduce the correlation introduced by selective filtering of data that is inherent to the transmission channel or to reduce the correlation introduced by formatting data.

The invention applies in particular to any type of cable or radio transmission system in which the data to be transmitted is discrete data and is subject to interference that causes correlation between received data items that has the effect of degrading the decision circuit of the receiver.

BACKGROUND OF THE INVENTION

With a multipath transmission medium, the reciprocal of the allocated transmission bandwidth B is equal to resolution of echoes "perceived" by the system ($\delta\tau \cong 1/B$). These echoes (delay and complex amplitude) are generated by waves reflected and diffracted by obstacles near the transmitter-receiver axis. They define coefficients of the impulse response of the propagation channel, which filters the communication signal within the bandwidth of the system. In broadband transmission with a bandwidth B (where B>channel coherence bandwidth), a small-size interleaver reduces to the scale of a few symbols the correlation of data items caused by the frequency-selective nature of the propagation channel. In narrowband transmission (where B<channel coherence bandwidth), correlation between data items is linked to narrowband variations of the radio-frequency field or ideal low-pass filtering of the data. Interleaving the transmitted data over a period greater than the channel coherence time enables decorrelation of data items at the receiver, after de-interleaving, and dissemination of data with a low signal-to-noise ratio. This increases the efficiency of the decision circuits in a digital transmission system receiver.

An interleaving law I(k) for a block of size K specifies the order in which an input data sequence formed by K data items indexed by an index k varying from 0 to K−1 must be read at the output. Let X(k) denote an input sequence of an interleaver with interleaving law I(k). Let Y(k) denote the output sequence of the interleaver. Then Y(k)=X(I(k)): the $k^{th}$ data item of the interleaved sequence having the position index k−1 corresponds to the data item of index I(k−1) of the input sequence X(0), ..., X(K−1). The interleaving law I(k) is a one-to-one function that has values in the space S={0, ..., K−1}. The interleaving spreading is defined as the smallest distance after interleaving between two position indices associated with two input data items X(k) and X(k+s) separated by s−1 data items. The interleaving spreading is given by the equation $\Delta I_{eff}(s) = \text{Min}_{k, k \in S} |I(k+s) - I(k)|$. The function |X| gives the absolute value of X.

The input data items to be interleaved and the interleaved output data items are represented in the remainder of this document only by their index k, unless otherwise indicated.

The invention is more particularly concerned with block interleaving techniques, i.e. interleaving techniques for which each block of data of size K is interleaved independently of any other block; here, the index k varies from 0 to K−1.

Some of these techniques are more specifically intended to combat fast fading and some are more specifically intended to improve the decoding circuits, in particular those for turbo-codes.

Interleaving algorithms for turbo-codes include relative prime (RP) interleavers described in particular in the paper by S. Crozier and P. Guinand, "High-Performance Low-Memory Interleaver Banks for Turbo-Codes", Proceedings of the 54th IEEE Vehicular Technology Conference (VTC 2001 Fall), Atlantic City, N.J., USA, pp. 2394-2398, Oct. 7-11, 2001.

RP algorithms were originally designed to generate interleaving matrices internal to turbo-codes. These algorithms, which are block interleaving algorithms with a block size K, yield a particular interleaving spreading between two interleaved data items. They are known for their property of relatively high interleaving spreading on relatively small block sizes. However, on large blocks, high interleaving spreading requirement involves a large number of non-interleaved data items inserted into a periodic structure. These algorithms generate an interleaving law defined by two parameters s and d and by a modulo K operation. The parameter s is a shift on the first data item and the parameter d is the distance between two successive data items after interleaving; d sets the value of the interleaving spreading between two successive interleaved data items and must be prime relative to K. In some circumstances these algorithms preserve a pattern of size p. The advantage of this property is that it lightens the infrastructure of a multichannel interleaving system and addresses specific constraints associated with overall optimization of the transmission system.

Preserving a data distribution pattern corresponding to p streams of multiplexed data presupposes that the parameter p is a sub-multiple of the block size K to be interleaved: the input data sequence S and output data sequence S' are formed by K/p partitions P each consisting of p data items. Preserving a pattern means that the ordering of the p data streams in each partition P is preserved after interleaving processing. Within a partition of size p, each data item belonging to a stream i, i={1, ..., p} retains its rank after interleaving. The data item at the position i in the sequence after interleaving is obviously no longer the same, but belongs to the same stream i. This property is reflected in the fact that the difference between the position index of the interleaved data item and its rank in the interleaved sequence is a multiple of p, which can be expressed by the following equation:

$$I(k) - k = Q(k) \times p \qquad (1)$$

in which k={0, ..., K−1} and Q(k) is a function in the relative integer space such that, whatever the value of k: Q(k)×p<K.

Thus a pattern of size p is preserved if equation (1) is satisfied: the difference between the position indices of rank k before and after interleaving is necessarily a multiple of the pattern of size p.

The interleaving law of an RP algorithm is given by the equation:

$$I(k) = [s + kd]_K \text{ where } k = \{0, \ldots, K-1\}, d = |I(k+1) - I(k)|$$

The operation $[X]_K$ corresponds to the modulo K operation applied to X and therefore represents the remainder of the division of X by K, in other words:

$$[X]_K = X - E\left(\frac{X}{K}\right) \cdot K$$

where E(z) is the integer part of z.

A restriction imposed by the algorithm is that K and d must be prime relative to each other. Consequently, only certain values of d are acceptable for a given size K and no value of d can correspond to the size of a pattern since pattern size is necessarily a sub-multiple of K. However, an analysis of different implementations of the algorithm shows that if d is chosen such that K is a multiple of d−1 then configurations exist for which a pattern of size p is preserved. In such circumstances, the quantity d−1 must be a multiple of p. This is reflected in the equation:

$$K = n \times (d-1) = n \times m \times p \quad (2)$$

In the situation where K=60, for example, the values of d such that K is a multiple of d−1 with d and K prime relative to each other are, for an interleaving spreading greater than 10: d=11, d=13 and d=31.

Figure 1:
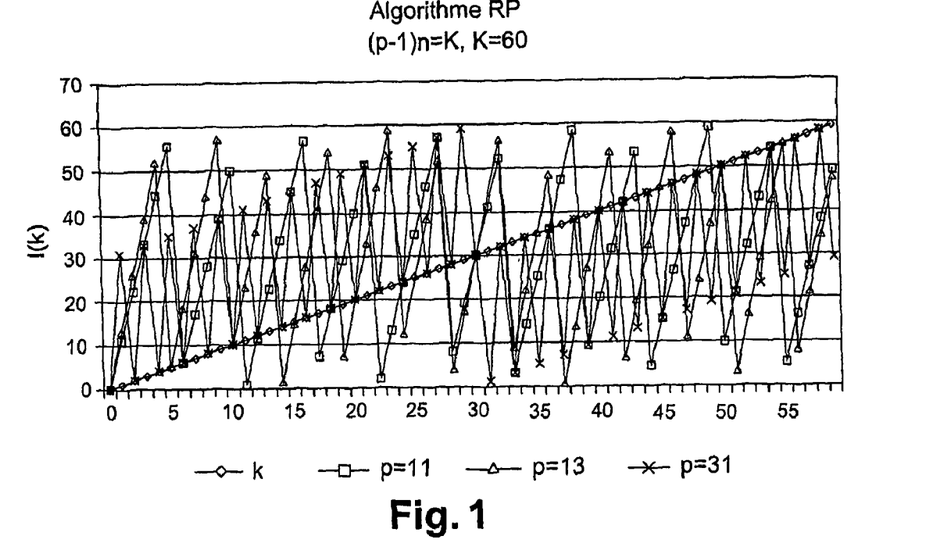
FIG. 1 is a graphical representation of an interleaving sequence obtained with a prior art RP algorithm for different values of p, where p is prime relative to the block size K.

The interleaving laws RP associated with these three values of d for K=60 are presented in FIG. 1. For each of these situations, different patterns of size p satisfying equation (2) can be preserved. Thus, for d=13, it is possible to preserve a pattern of size p={3, 6, 12}. For d=31, it is possible to preserve a pattern of size p {3, 5, 6, 10}. Observation of the interleaving laws shows that a disadvantageous periodicity arises when the interleaving spreading d increases. Furthermore, the number of non-interleaved data items, i.e. the data items for which I(k)=k, increases with d.

Thus under certain conditions an RP algorithm effectively preserves a pattern of size p and fixes an interleaving spreading d of the data, but the values p and d must be low in order to limit the periodic structures and to limit the number of non-interleaved data items after interleaving.

Figure 2:
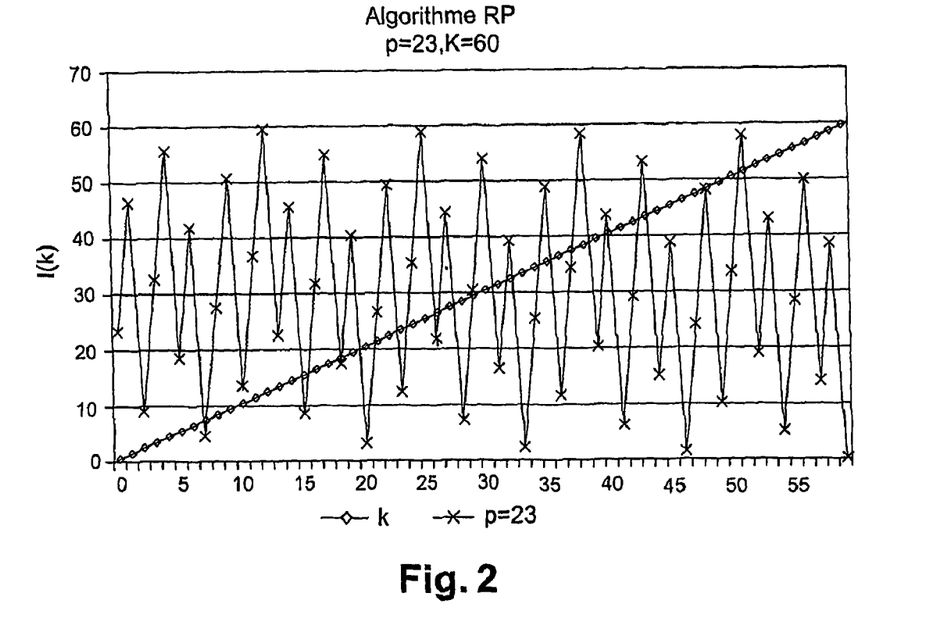
FIG. 2 is a graphical representation of an interleaving sequence obtained with a prior art RP algorithm for a value of p such that p−1 is not a sub-multiple of K.

If d−1 is not a sub-multiple of K then an RP algorithm cannot systematically preserve a pattern of size p, where K is a multiple of p. This is illustrated by the following example, with reference to FIG. 2: K=60 and d=23 (d−1=22 is not a sub-multiple of K). Consider a pattern of size p=3, chosen at random. Table 1 in Appendix 1 gives the quantity R'(k) corresponding to a pattern of size p=3, a value of d=23, a value of K=60, and the interleaving law of the RP technique:

$$R'(k) = \frac{I(k) - k}{3} \quad \forall k = \{0, \ldots, 59\}$$

Because R'(k) has values in the real number space and not in the relative integer space, there is no systematic preservation of a pattern.

The preservation of the pattern by an RP algorithm advantageously enables simultaneous processing in a transmission system of interleaving intended to produce effects on a medium scale and interleaving intended to produce effects on a small scale (turbo-codes, interleaving within an OFDM symbol), and consequently optimizes the transmission system as a whole. However, the preservation of a pattern by an RP algorithm requires at least the parameter p to be prime relative to K, which can be regarded as a severe constraint.

SUMMARY OF THE INVENTION

One object of the present invention is to provide an interleaving method of blocks of size K preserving a pattern that simultaneously processes in a transmission system interleaving intended to produce effects on a medium scale and interleaving intended to produce effects on a small scale (turbo-codes, interleaving within an OFDM symbol) and which consequently optimizes the transmission system as a whole whilst being less constraining than the prior art RP method.

This and other objects are attained in accordance with one aspect of the present invention directed to a block interleaving method with a block size K and with N iterations of index j, N being greater than or equal to 1, for use with digital data items indexed by a variable k={0, . . . , K−1} for positioning input digital data items X in an output sequence made up of output digital data items Y in an order determined by an interleaving law $I^{(j)}(k)$ such that $Y(k) = X \, I^{(j)}(k))$ comprises:

a first step of calculating an intermediate value $I_0^{(j)}(k)$ that for the first iteration (j=1) is the result of applying a first algebraic function $f_0(a, b)$ modulo K with two variables a and b to the input indices k, a=b=k and for each subsequent iteration j(j=2 to N) is the result of applying the same algebraic function $f_0(a, b)$ to the input indices k and to an output value $I^{(j-1)}(k)$ obtained during the preceding iteration;

a second step of calculating the output value $I^{(j)}(k)$ that, for a given iteration j, is the result of applying a second algebraic function $f_1(a, b)$ modulo K with two variables a and b to the input indices k and to the intermediate value $I_0^{(j)}(k)$ calculated in the same iteration j, a=k and b=$I_0^{(j)}(k)$. The first algebraic function $f_0(a, b)$ and the second algebraic function $f_1(a, b)$ are linked so that, on each iteration j, the difference between the position index of the interleaved data item and its rank in the interleaved sequence is the product modulo K of a parameter p depending on the size of a pattern to be preserved and the sum of a natural integer parameter a that can vary from 0 to K/p and a multiple of the intermediate value.

Another aspect of the present invention is directed to a block interleaving device with a block size K and with N iterations of index j where N is greater than or equal to 1 for use with digital data items indexed by a variable k={0, . . . , K−1}. Said device comprises N basic cells I with two inputs and one output, such that each basic cell I is formed of two individual cells $I_0$ and $I_1$ each of which has two inputs and one output, the output of the basic cell I corresponding to the output of the individual cell $I_1$, the two inputs of the basic cell I corresponding to the two inputs of the individual cell $I_0$, the output of the individual cell $I_0$ corresponding to a first input of the individual cell $I_1$, the second input of the individual cell $I_1$ being connected to a first input of the individual cell $I_0$ that corresponds to a first input of the basic cell I.

The two inputs of the first basic cell I are linked to each other and correspond to the index k. The output of each basic cell I is connected to the second input of the basic cell I of the next iteration. The first inputs of the basic cells I are linked to each other.

Thus by means of a turbo structure, interleaving in accordance with an embodiment of the invention generates a block-type interleaving law defined by a combination of algebraic functions.

The interleaving method uses a turbo structure that has two inputs and one output. After each iteration j, the interleaving law $I^{(j)}(k)$ at the output of the interleaver is modified in accordance with an input sequence formed of the position indices of the data items before interleaving (typically a ramp) and in accordance with an interleaved sequence resulting from the preceding iteration of the same interleaving algorithm (which gives the position of the data items after interleaving).

The interleaving method and device of an embodiment of the invention solve the stated problem. The interleaving law $I^{(j)}(k)$ is such that equation (1) is satisfied for all iterations j and all values k, p, q and K. The size p of the pattern is a parameter of the interleaver.

The interleaving law in accordance with the invention depends on four parameters:
- K, the block size to be interleaved;
- p, which depends on the size of a pattern to be preserved;
- q, which adds a degree of freedom to the adjustment of the interleaving law;
- N, the number of iterations.

Thus the invention preserves a pattern of size p that corresponds to p multiplexed streams.

The parameter p can be made equal to a multiple of a parameter $p_i$ corresponding to an individual pattern or can advantageously be the result of combining a plurality of individual patterns ($\Pi p_i = p$) to be preserved. The individual distribution pattern is similar to multiplexing p data streams (multichannel, MIMO systems). This multiplexing can be real or virtual, or associated with a coding operation that confers different properties on the bits in a bit stream of size p before modulation. It can correspond to a pattern fixed by the user that is intended to optimize the overall performance of the transmission system via a specific order of the data items at transmission time specified before or after interleaving. Thus interleaving in accordance with the invention preserves optimum solutions in terms of coding (space-time, binary to symbol coding, external constraint associated with a turbo-coder) and ordering data (following multiplexing, for example) before or after interleaving. The parameter p is preferably determined either in relation to optimization of the algorithm by increasing the interleaving spreading $\Delta I_{\it eff}^{(j)}(s) = \text{Min}_{k, k \in S} |I^{(j)}(k+s) - I^{(j)}(k)|$ in accordance with a given criterion for a given iteration j or as a function of an external constraint, typically an optimization. constraint, imposed by other processing modules of the transmission system.

The mathematical law that fixes the interleaving spreading after interleaving between two successive data items and more generally between two data items separated by s−1 data items depends on three parameters: the size p of the pattern to be preserved, a parameter q, and the number of iterations effected in the turbo structure of the invention. The interleaving spreading is given by an algebraic function.

The interleaving spreading is calculated using fundamental properties of a modulo K operation applied to the polynomial $Pj,s(k) = \Delta I^{(j)}(s)$ defining the dispersion between two data items separated by s−1 data items linked to the number of iterations j of the basic algorithm I:

$$Pj,s(k) = I^{(j)}(k+s) - I^{(j)}(k) \tag{3}$$

where s<K

For a fixed iteration j, the algebraic expression of the algorithm generates a pseudoperiodic interleaved data structure that represents the interleaved data in two dimensions in a plane X-Y and supplies two interleaving spreading values, one for the axis X and one for the axis Y. The axis Y is used to represent the interleaving spreading $\Delta y = \Delta_{\it eff} I^{(j)}(s=1)$ between two successive data items and the axis X to represent the interleaving spreading $\Delta x = \Delta_{\it eff} I^{(j)}(s=s1)$ between two data items separated by $s_1 - 1$ data items, si corresponding to the pseudoperiod of the interleaving law. By convention, the pseudoperiod corresponds to the length (to the nearest sample) of a sub-sequence si during which the interleaving spreading $\Delta y$ is constant and equal to $\Delta_{\it eff} I^{(j)}(s=1)$. The value of the parameter si depends on the value of p selected and on the associated interleaving spreading $\Delta_{\it eff} I^{(j)}(s=1)$ for the iteration j. This pseudoperiodic structure is used to optimize the interleaving operation in accordance with an external constraint. External constraints are typically linked to the transmission medium and to the framing of the data, which optimize other processing operations of the transmission system (data distribution pattern in a code word, mapping, etc.). Optimizing the interleaving operation consists in distributing the interleaved data with a specific arrangement. In one particular embodiment, the distribution of the coded bits in QAM cells can be optimized taking account of this pseudoperiodic structure. The parameters p and q of the interleaver of the invention can be judiciously adjusted so that the equally weighted bits of close QAM cells have a maximum interleaving spreading, at the same time as ensuring an optimized interleaving spreading between different weighted bits within each QAM cell.

For iterations after the first, to generate its own interleaving pattern, the turbo structure of the transmission interleaver uses conjointly the pattern of the interleaved sequence of the preceding iteration and the position indices of the original sequence. By selecting the right iteration, this property dynamically adapts the interleaving law and therefore the output interleaved sequence as a function of the properties or evolution of the transmission medium. Adjustment and optimum determination of the parameters of the interleaving algorithm therefore modify conjointly:
- the interleaving spreading $\Delta_{\it eff} I^{(j)}(s)$ between two successive data items of the overall data stream, s=1;
- the interleaving spreading $\Delta_{\it eff} I^{(j)}(s)$ of data items from the same stream i, i={1, ..., p}, s=p;
- the interleaving spreading $\Delta_{\it eff} I^{(j)}(s)$ between two data items separated by L−1 data items where L is fixed by an external constraint, s=L; that constraint can be:
- the distribution of the bits at the time of binary to symbol coding;
- specific formatting of the data for transmission.

The pseudoperiodic structure of interleaving in accordance with the invention:
- ensures a maximum distance between the position indices associated with data items of the same weight in symbols after binary to symbol coding followed by digital modulation;
- specifically orders the data for transmission of the data on the physical medium.

This pseudoperiodic structure confers a multidimensional structure on the interleaving pattern of the invention and proves less complex in use than an interleaving structure applied to each branch of a multichannel system.

In this preferred embodiment, the first algebraic function $f_0(a,b)$ has the expression:

$$f_0(a,b) = [-a - pb]_K \tag{4}$$

and the second algebraic function $f_1(a,b)$ has the expression:

$$f_1(a,b) = [\alpha p + a + qpb]_K \tag{5}$$

The intermediate data item $I_0$ is then expressed after the first iteration in the form:

$$I_0^{(1)}(k) = f_0(k,k) = [-k - pk]_K \tag{6}$$

and after each subsequent iteration in the form:

$$I_0^{(j)}(k) = f_0(k, I^{(j-1)}(k)) = [-k - p \cdot I^{(j-1)}(k)]_K \tag{7}$$

After each iteration the interleaved output data item $I^{(j)}(k)$ is expressed in the form:

$$I^{(j)}(k)=I_1^{(j)}(k)=f_1(k,I_0^{(j)}(k))=[\alpha p+k+q\cdot p\cdot I_0^{(j)}(k)]_K \quad (8)$$

where q and $\alpha$ are parameters that are typically natural integers, $\alpha$ varying from 0 to K/p.

Given that the respective inputs b of the two algebraic functions $f_0$ and $f_1$ are respectively fed with calculations from the preceding iteration and the intermediate value $I_0$ for the same iteration, the two inputs a and b are not independent variables. Consequently, $I_0$ and $I_1$ depend only on the variable k, the position index of the data items in the input sequence.

The invention described here relates to an interleaving method and device. The steps of a preferred embodiment of the method are determined by instructions of an interleaving program incorporated in an electronic circuit such as a microchip that can itself be incorporated in an electronic device such as a transmitter. The interleaving method of the invention can equally well be executed when the program is loaded into a computation unit such as a processor or the like, whose operation is then controlled by executing the program.

Consequently, an implementation of an embodiment of the invention is a computer program on or in an information medium. The program can be in any programming language and in the form of source code, object code or an intermediate code between source code and object code, such as in a partially compiled form, or in any other form desirable for implementing a method according to the invention.

The information medium can be any entity or device capable of storing the program. For example, the medium can consist of storage means such as a ROM, for example a CD ROM or a microelectronic circuit ROM, or magnetic storage means, for example a diskette (floppy disk) or a hard disk.

Alternatively, the information medium can be an integrated circuit in which the program is incorporated, the circuit being adapted to execute the method in question or to be used in its execution.

The interleaving program can also be translated into a transmissible form such as an electrical or optical signal that can be routed via an electrical or optical cable, by radio or by other means. The program of the invention can in particular be downloaded over an Internet-type network.

DETAILED DESCRIPTION OF THE DRAWINGS

Figure 3:
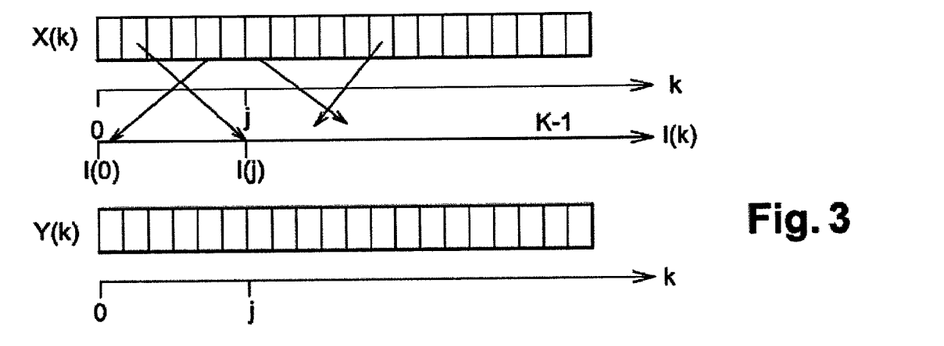
FIG. 3 is a diagram illustrating an interleaving operation.

FIG. 3 illustrates the concept of interleaving. It represents a data sequence X(k) at the input of an interleaver with an interleaving law I(k). The output data sequence Y(k) is linked to the input sequence by the equation:

$$Y(k)=X(I(k)) \text{ where } k=\{0, \ldots, K-1\} \text{ and } I(k)=\{0, \ldots, K-1\}.$$

Figure 4:
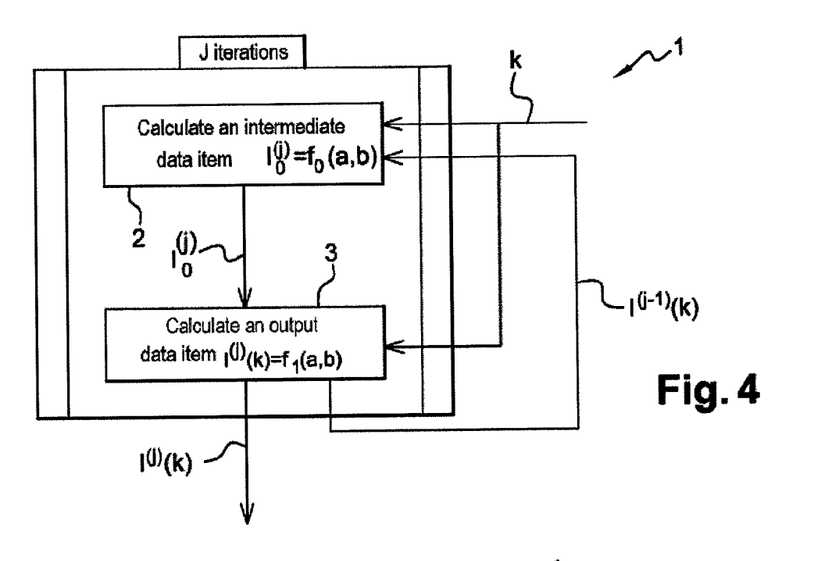
FIG. 4 is a flowchart of an interleaving method in accordance with an embodiment of the invention.

FIG. 4 represents a flowchart of one particular embodiment of an interleaving method of the invention.

An interleaving method 1 of the invention with N iterations effects the constrained interleaving of an input digital data block of size K indexed by a variable $k=\{0, \ldots, K-1\}$, preserving a pattern of size p or whose size is a sub-multiple of p.

In a first step 2, the method 1 calculates an intermediate value $I_0^{(j)}(k)$ which is the result of a first modulo K algebraic function $f_0(a,b)$ with two inputs a and b.

In the preferred embodiment, the first algebraic function is such that $f_0(a,b)=[-a-bp]_K$ where p is a parameter linked to the pattern, which yields:

$$I_0^{(j)}(k)=[-a-bp]_K.$$

For the first iteration, the inputs a and b are interlinked and correspond to the input indices k, a=b=k, in other words for this preferred embodiment:

$$I_0^{(1)}(k)=[-k-kp]_K \text{ where } k=\{0,\ldots,K-1\} \quad (9)$$

For the next N−1 iterations, this intermediate value $I_0^{(j)}(k)$ is the result of applying the same algebraic function $f_0(a,b)$ to the input indices k and to an output data item $I^{(j-1)}(k)$ obtained on the preceding iteration, such that $I_0^{(j)}(k)=f_0(a,b)$ where a=k and $b=I^{(j-1)}(k)$, that is to say, for the preferred embodiment:

$$I_0^{(j)}(k)=[-k-I^{(j-1)}(k)\times p]_K \quad (10)$$

In a second step 3, the method 1 calculates an interleaved output data item $I^{(j)}(k)$ which is the result of a second algebraic function $f_1(a,b)$ of the input indices k and the intermediate value $I_0^{(j)}(k)$ such that:

$$I^{(j)}(k)=f_1(k,I_0^{(j)}(k)) \quad (11)$$

In the preferred embodiment, the second algebraic function is such that:

$$f_1(a,b)=[\alpha p+a+q\cdot p\cdot b]_K$$

which yields, for $I^{(j)}(k)$:

$$I^{(j)}(k)=f_1(a,b)=[\alpha p+k+q\cdot p\cdot I_0^{(j)}(k)]_K \quad (12)$$

in which $\alpha$ is a natural integer varying from 0 to K/p and q is a parameter that is a natural integer.

In one particular instance of the preferred embodiment $\alpha=K/p-1$. Then:

$$I^{(j)}(k)=[K-p+k+q\cdot p\cdot I_0^{(j)}(k)]_K$$

Figure 5:
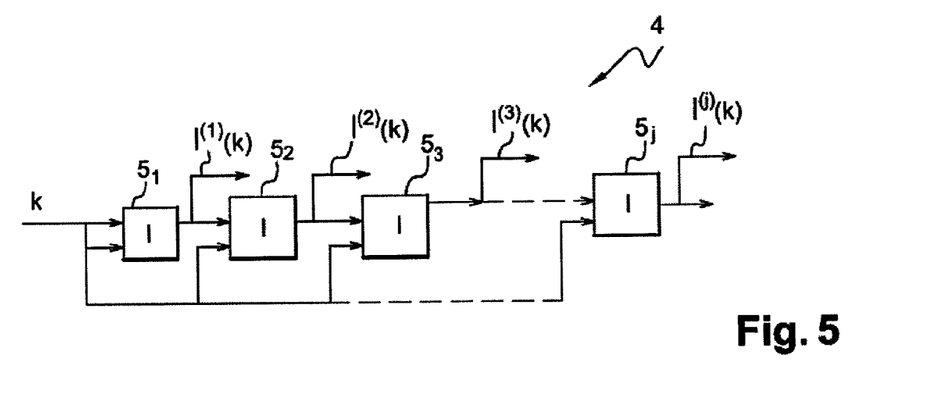
FIGS. 5, 6a and 6b are diagrams that represent the basic principle of the structure of an interleaver in accordance with an embodiment of the invention.
Figure 6A:
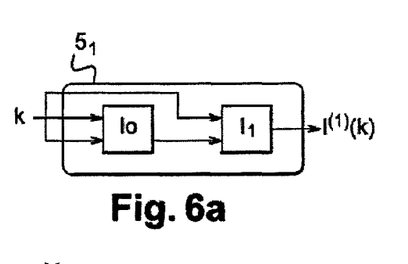
Figure 6B:
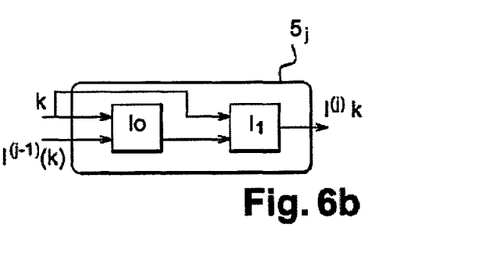

FIGS. 5, 6a and 6b are diagrams that represent the basic principle of the structure of an interleaver of the invention adapted to implement an interleaving method of the invention.

FIG. 5 is a diagram that represents an interleaver 4 with N iterations, i.e. N basic cells I labeled $5_1, 5_2, 5_3, 5_j$.

FIGS. 6a and 6b are magnified views of a base cell I from the FIG. 5 diagram; the basic cell $5_1$ from FIG. 6a, respectively FIG. 6b, corresponds to the first iteration, respectively to iterations for which j is not equal to 1.

The output of the $j^{th}$ basic cell $5_j$, which corresponds to the $j^{th}$ iteration, yields an interleaved sequence that is expressed in the form $I^{(j)}(k)$.

Each cell $5_1, 5_2, 5_3, 5_j$ of the interleaver has the same structure: two inputs, one output and two individual cells labeled $I_0$ and $I_1$ in FIGS. 6a and 6b. Each individual cell $I_0, I_1$ has two inputs and one output. The two inputs of the individual cell $I_0$ correspond to the two inputs of the base cell I to which it belongs and the output of the individual cell $I_1$ corresponds to the output of the base cell I to which it belongs. The output of the base cell $I_0$ is connected to an input of the individual cell $I_1$. The second input of the individual cell $I_1$ is connected to an input of the base cell I; this input of the base cell I is fed with the indices k to be interleaved, which generally take the form of a ramp from 0 to K−1. The second input of a base cell I is connected to the output of the preceding base cell I, except for the first base cell $5_1$ (FIG. 6a), the two inputs of which are connected to each other.

This representation is schematic in that the turbo structure can be produced differently, for example with a single base cell I and a loopback system between the output and the inputs, this combination being adapted to execute a method of the invention.

The basic interleaving I(k) effected by a basic cell $5_1$, $5_2$, $5_3$, $5_j$ results from a hierarchical structure formed of the two individual cells $I_0$ and $I_1$. The individual cell $I_0$ includes calculation means adapted to calculate the first algebraic function $f_0$ modulo K with two inputs a, b where a=k. The individual cell $I_1$ includes calculation means adapted to calculate the second algebraic function $f_1$ modulo K with two inputs a and b, where a=k.

For the preferred embodiment, this is reflected in the following equations:

$$I_0(k)=f_0(k,b)=[-k-bp]_K \text{ where } k=\{0,\ldots,K-1\} \quad (13)$$

and:

$$I_1(k)=f_1(k,b)=[\alpha p+k+b\cdot p\cdot q]_K \text{ where } k=\{0,\ldots,K-1\} \quad (14)$$

For the first cell $5_1$, which corresponds to the first iteration, j=1, the inputs a and b of the individual cell $I_0$ are interconnected, and consequently:

$$I_0^{(1)}(k)=f_0(k,k)=[-k-kp]_K \text{ where } k=\{0,\ldots,K-1\} \quad (15)$$

The hierarchical structure of the cell $5_1$, $5_2$, $5_3$, $5_j$ implies that the input b of the individual cell $I_1$ is fed by the output of the individual cell $I_0$; the cell $5_1$, $5_2$, $5_3$, $5_j$ itself has a turbo structure.

$$I_1(k)=f_1(k,I_0(k))=[\alpha p+k+I_0(k)\cdot p\cdot q]_K \text{ where } k=\{0,\ldots,K-1\} \quad (16)$$

In the preferred embodiment, the interleaving obtained by a cell $5_1$, $5_2$, $5_3$, $5_j$ is the result of an algebraic function f:

$$I(k)=f(p,q,k,K)=[\alpha p+k+I_0(k)\cdot p\cdot q]_K \text{ where } k=\{0,\ldots,K-1\} \quad (17)$$

For the first cell $5_1$ (first iteration), substituting its expression for $I_0(k)$ yields:

$$I^{(1)}(k)=[\alpha p+k+p\cdot q\cdot[-k-kp]_K]_K \text{ where } k=\{0,\ldots,K-1\} \quad (18)$$

The interleaving I(k) obtained by a basic cell I is integrated into a turbo structure, and consequently, for iteration 2:

$$I_0^{(2)}(k)=[-k-p\times I^{(1)}(k)]_K \text{ where } k=\{0,\ldots,K-1\}$$

and the interleaving law is given by:

$$I^{(2)}(k)=[\alpha p+k+I_0^{(2)}(k)\cdot p\cdot q]_K \text{ where } k=\{0,\ldots,K-1\}$$

$$I^{(2)}(k)=[\alpha p+k+p\cdot q\cdot[-k-p\cdot I^{(1)}(k)]_K]_K$$

and more generally, for iteration j:

$$I_0^{(j)}(k)=[-k-p\cdot I^{(j-1)}(k)]_K k=\{0,\ldots,K-1\} \quad (19)$$

and the interleaving law for iteration j is given by:

$$I^{(j)}(k)=[\alpha p+k+p\cdot q\cdot I_0^{(j)}(k)]_K k=\{0,\ldots,K-1\}$$

$$I^{(j)}(k)=[\alpha p+k+p\cdot q\cdot[-k-p\cdot I^{(j-1)}(k)]_K]_K k=\{0,\ldots,K-1\} \quad (20)$$

This law $I^{(j)}(k)$ preserves a pattern of size p because it satisfies equation (1):

$$I^{(j)}(k)-k=Q(k)\times p \text{ where } k=\{0,\ldots,K-1\};$$

where Q(k) is a function in the relative integers space Z such that, for any value of k, Q(k)×p<K.

In fact:

$$I^{(j)}(k)-k=[\alpha p+p\cdot q\cdot I_0^{(j)}(k)]_K k=\{0,\ldots K-1\}$$

$$I^{(j)}(k)-k=p[\alpha+q\cdot[-k-p\cdot I^{(j-1)}(k)]_K]_K k=\{0,\ldots K-1\} \quad (21)$$

The value Q(k) is indeed an integer value: equation (1) is satisfied for any iteration j, any value of k and any value of q.

The invention can advantageously specify the interleaving spreading between successive input data items. The distance between two successive data items, and more generally the interleaving spreading between data items separated by s−1 data items, is estimated algebraically by expanding the equations of the interleaving law and taking into account the properties of the modulo operation based on the following properties:

$$[a+b]_N=[[a]_N+[b]_N]_N$$

$$[a\cdot b]_N=[[a]_N\cdot[b]_N]_N$$

For iteration j, $\Delta_{eff}I^{(j)}(s=1)$ designates the interleaving spreading between two successive data items and $\Delta I^{(j)}(k)$ the difference between $I^{(j)}(k+1)$ and $I^{(j)}(k)$. This last result can be negative and include two values resulting from the pseudo-periodic structure of the interleaving pattern, which introduces a discontinuity into the interleaving pattern. Following the interleaving operation of the $j^{th}$ iteration, the difference in position of two data items read in the input sequence and placed at the interleaver output is defined mathematically by two numbers $\Delta I^{(j)}(k)$ and $\Delta I_c^{(j)}(k)$. The interleaving spreading $\Delta_{eff}I^{(j)}(s=1)$ corresponds to whichever of the above two differences has the lower absolute value that remains constant to the nearest data item over an observation window of size equal to $L^{(j)}(p, q)$.

For iteration j=1, the two differences are given by the equations:

$$\Delta I^{(1)}(k)=I^{(1)}(k+1)-I^{(1)}(k)$$

$$\Delta I_c^{(1)}(k)=K-|\Delta^{(1)}I(k)| \text{ and}$$

the interleaving spreading is given by the equation:

$$\Delta_{eff}I^{(1)}(s=1)=\text{Min } \{|I^{(1)}(k+1)-I^{(1)}(k)|, K-|I^{(1)}(k+1)-I^{(1)}(k)|\}$$

The method of estimating the difference $\Delta I(k)$ is based on expanding the equations of the interleaving relationship. The difference $\Delta I(k)$ is deduced from the expressions for I(k) and I(k+1) and from the result of subtracting these two elements.

In the preferred embodiment, the interleaving spreading is expressed in the following form, for iteration j=1:

$$\Delta_{eff}I^{(1)}(s=1)=\text{Min } \{|\Delta I^{(1)}(k)|, K-|\Delta I^{(1)}(k)|\}=\text{Min } \{|[1-q\cdot p(1+p)]_K|, K-|[1-q\cdot p(1+p)]_K|\}$$

because:

$$I^{(1)}(k)=[\alpha p+k+qp[-k-pk]_K]_K k=\{0,\ldots,K-1\}$$

$$I^{(1)}(k+1)=[\alpha p+k+1+qp[-(k+1)-p(k+1)]_K]_K$$

$$\Delta I^{(1)}(k)=[1-qp(p+1)]_K$$

For iteration j=2:

$$\Delta_{eff}I^{(2)}(s=1)=\text{Min } \{|\Delta I^{(2)}(k)|, K-|\Delta I^{(2)}(k)|\}=\text{Min } \{|[1-qp(1+p\Delta I^{(1)}(k))]_K|, K-|[1-qp(1+p\Delta I^{(1)}(k))]_K|\}$$

because:

$$I^{(2)}(k) = [\alpha p + k + qpI_0^{(2)}(k)]_K = [\alpha p + k - qp[k + pI^{(1)}(k)]_K]_K$$

$$\Delta I^{(2)}(k) = I^{(2)}(k+1) - I^{(2)}(k) = [1 - qp(1 + p\Delta I^{(1)}(k))]_K$$

where $k = \{0, \ldots, K-1\}$ and
thus for iteration j:

$$\Delta_{\mathit{eff}} I^{(j)}(s=1) = \mathrm{Min}\{|\Delta I^{(j)}(k)|, K - |\Delta I^{(j)}(k)|\} = \mathrm{Min}\{|[1 - qp(1 + p\Delta I^{(j-1)}(k))]_K|, K - |[1 - qp(1 + p\Delta I^{(j-1)}(k))]_K|\}$$

because:

$$I^{(j)}(k) = [\alpha p + k + qpI_0^{(j)}(k)]_K = [\alpha p + k + qp[-k - pI^{(j-1)}(k)]_K]_K \quad k = \{0, \ldots, K-1\}$$

$$\Delta I^{(j)}(k) = [1 - qp(1 + p\Delta I^{(j-1)}(k))]_K$$

$$L^{(1)}(p, q) = E\left\{\frac{K}{\Delta_{\mathit{eff}} I^{(1)}(s=1)}\right\}$$

The size of the observation window during which the difference $\Delta I^{(j)}(k)$ is constant is expressed in the following form, to the nearest data item: for iteration 1;
where $E\{Z\}$ is the integer part of Z, and:

$$L^{(j)}(p, q) = E\left\{\frac{K}{|\Delta_{\mathit{eff}} I^{(j)}(s=1)|}\right\}$$

for iteration j.

More generally, following iteration j, the interleaving spreading over the global stream between two data items separated by s−1 data items is expressed in the form:

$$\Delta_{\mathit{eff}} I^{(j)}(s) = \mathrm{Min}\{|[s - q \cdot p(s + pP_{j,s}(k))]_K|, K - |[s - qp(s + pP_{j,s}(k))]_K|\}$$

where:

$$P_{j,s}(k) = I^{(j)}(k+s) - I^{(j)}(k) = [s - q \cdot p \cdot (s + p \cdot P_{j-1,s}(k))]_K$$

$$P_{1,s}(k) = [s - qp \times s(p+1)]_K$$

The above expressions are used to calculate the difference $\Delta I^{(j)}(k)$ and the interleaving spreading $\Delta_{\mathit{eff}} I^{(j)}(s=1)$ after any iteration between two successive data items and more generally between two data items separated by s−1 data items. The interleaving spreading can therefore be calculated for different values of s and the number of iterations N can be determined by assigning it the value of the iteration j for which the interleaving spreading values associated with targeted s values are all greater than an interleaving spreading threshold specified for each s value.

This algebraic property of the interleaving algorithm of the invention, which has a pseudoperiodic structure, induces a two-dimensional interleaving spreading structure allowing an optimization of the interleaving operation in accordance with a plurality of external constraints. This optimization of interleaving therefore preserves the data multiplexing constraints imposed by optimizing processing downstream and upstream of the interleaving operation.

Thus the algorithm is optimized by the algebraic properties of interleaving in accordance with the invention that are modified by the number of iterations using a base cell I and the chosen values of p and q.

An optimization procedure for optimum multiplexing of data before formatting consists in:
  Step 1) selecting p and q for an interleaving size K, where K is a multiple of p.
  Step 2) estimating the interleaving spreading $\Delta_{\mathit{eff}} I^{(j)}(s=1)$ and the maximum interleaving spreading over a pseudo-period: $\Delta_{\mathit{eff}} I^{(j)}(s = L^{(j)}(p,q) - 1) = (L^{(j)}(p,q) - 1) \cdot \Delta_{\mathit{eff}} I^{(j)}(s=1)$.
  Step 3) for one or more external constraints, evaluating the interleaving spreading $\Delta_{\mathit{eff}} I^{(j)}(s)$ for different values of j between data items separated by s−1 data items in relation to the external constraint that fixes the value of the integer parameter s.
  Step 4) selecting the iteration j that yields the greatest interleaving spreading between data items separated by s−1 data items in circumstances where s is fixed by an external constraint and $s = L^{(j)}(p,q) - 1$. If there is more than one iteration producing identical values with a different interleaving law, the iteration that yields the greatest interleaving spreading between successive data items is selected.
  repeating steps 1), 2), 3) if the values of p and q are not the optimum in relation to one or more thresholds So(s) set by the user. If p is imposed by an external constraint, then only the value q is modified.

Figure 7:
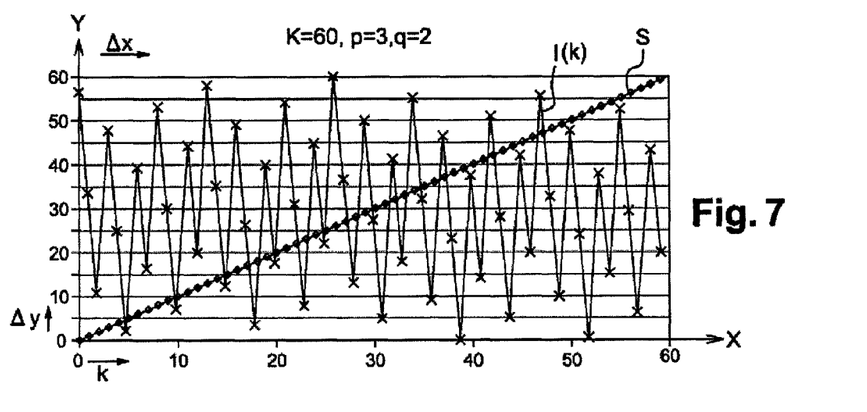
FIG. 7 is a graphical representation of an interleaving sequence obtained in one particular optimization of interleaving in accordance with an embodiment of the invention.

The following examples corresponding firstly to FIG. 7 and Table 2 in Appendix 2, and secondly to Tables 3 and 4 in Appendix 2, illustrate this kind of optimization operation.

Let K be the size of the block to be interleaved. It is a question of defining p, q and the number of iterations to take into account for optimizing the distribution of the interleaved data items following formatting imposed by a transmission system. To this end, the function I(k) is represented in the plane X-Y with the interleaving pattern on the axis Y and the indices k on the axis X. This representation, see FIG. 7, defines the order in which the data items must be read at the output of the interleaver. The ordinate gives the position of the data item in the input sequence while the abscissa axis indicates the position at which the data item is placed in the output sequence. The optimization procedure consists in distributing the data in accordance with this structure at the same time as taking account of an external constraint for adjusting the pattern, in this example binary to symbol coding. The non-interleaved sequence S added to FIG. 7 shows that all the data items are interleaved because none satisfies the equation I(k)=k.

Table 2 in Appendix 2 gives the distribution of the interleaved bits in different QAM cells for block interleaving of size K=60 with parameters p=3 and q=2 and for the same interleaving law. This assumes that an initial pattern of bits of size 3 imposed by an external constraint must be preserved. An x-QAM cell is made up of m=Log2(x) bits grouped into two sets of m/2 bits. Thus a 16-QAM cell is made up of bits b3, b2, b1 and b0. The bits of the same weight are firstly b0 and b2, and secondly b3 and b1. A 64-QAM cell is made up of bits b5, b4, b3, b2, b1, b0. The bits of the same weight are b0 and b3, b1 and b4, b2 and b5. The interleaving spreading between two successive bits corresponds to $\Delta_{\mathit{eff}} I^{(j)}(s=1)$ and the interleaving spreading between two bits of the same weight separated by m−1 bits belonging to two adjacent x-QAM cells corresponds to $\Delta I_{\mathit{eff}}(s=m)$. Setting the parameters of interleaving in accordance with the invention consists in selecting the iteration j that conjointly yields the highest interleaving spreading firstly between bits of the same weight belonging to adjacent x-QAM cells, $\Delta_{\mathit{eff}}(s=m)$, because that impacts on the de-correlation of the symbols received by the receiver and improves the efficiency of the dispersion circuits, and secondly between successive bits, $\Delta_{\mathit{eff}} I(s=1)$.

Table 2 shows that, for 64-QAM, iterations 1 and 3 produce the same interleaving spreading $\Delta I_{\mathit{eff}}(6) = 18$ between bits of the same weight. Optimization consists in selecting whichever of the iterations 1 and 3 gives the greatest interleaving spreading $\Delta e_{\mathit{eff}} I^{(j)}(s=1)$, $j=\{1,3\}$ between two successive bits: the 1st iteration. As for 16-QAM, optimization consists in selecting the iteration 1 that gives the greatest interleaving spreading $\Delta I_{\mathit{eff}}(4)=28$ between bits of the same weight associated with adjacent QAM cells and that leads to the greatest interleaving spreading $\Delta_{\mathit{eff}} I(s=1)=23$ between successive bits.

Table 2 shows that the values of p and q chosen are more appropriate to mapping interleaved bits codes in 16-QAM than to distributing interleaved bits codes in 64-QAM cells: the interleaving spreading of bits of the same weight is greater between 16-QAM cells. Thus use of the pattern is the optimum for mapping in 16-QAM with only one iteration.

Tables 3 and 4 show an optimization procedure during which steps 1), 2), 3) are reproduced to find an optimum value of p. For 64-QAM modulation, Table 3 shows that the optimum value of p is 6 or 12 for an iteration equal to 2 because this produces firstly the greatest interleaving spreading between bits of the same weight belonging to different QAM cells, $\Delta I_{\mathit{eff}}(6)=30$, and secondly the greatest interleaving spreading between two successive bits $\Delta_{\mathit{eff}} I(1)=25$.

For 16-QAM modulation, Table 4 shows that the optimum value of p is 3 or 6 for an iteration equal to 1 because it produces the greatest interleaving spreading firstly between bits of the same weight associated with different QAM cells, $\Delta I_{\mathit{eff}}(4)=28$, and secondly between two successive bits, $\Delta_{\mathit{eff}} I(k)=23$.

Optimization is reflected in an improvement in radio performance, i.e. in a reduction in the received bit error rate and consequently an increase in the quality of service (QoS) and the overall capacity of the transmission system.

Figure 8:
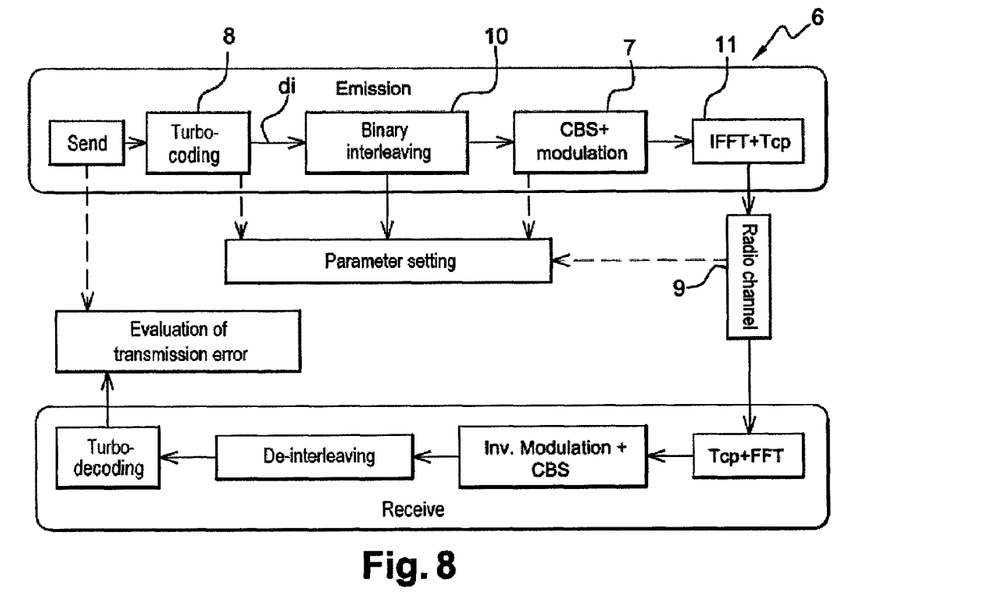
FIG. 8 is a diagram illustrating use of interleaving in accordance with an embodiment of the invention in a send/receive system.

FIG. 8 illustrates an example of use of the invention applied to a radio transmission system 6. The algorithm of the invention optimizes the performance of the radio transmission system 6 in terms of the bit error rate by exploiting the pseudoperiodic structure of the interleaver. The configuration selected is an SISO configuration, for which interleaving is intended to reduce the impact of Rayleigh fading which generates bursts of errors in the receiver after decoding. The structure is optimized to ensure maximum interleaving spreading between equally weighted bits of different 64-QAM cells 7 and between two successive bits on multipath channels. The interleaving spreading between different 64-QAM cells take into account both the interleaving spreading between adjacent QAM cells $\Delta_{\mathit{eff}} I(s=6)$ and the maximum interleaving spreading $\Delta_{\mathit{eff}} I(s\ L^{(j)}(p,q)-1)$ in a period $L^{(j)}(p,q)$ between QAM cells. A size $L^{(j)}(p,q)$ such as $L^{(j)}(p,q)=mn+m/2$, where m represents the number of bits per symbol and n is an integer to be adjusted, is the optimum for guaranteeing a maximum average interleaving spreading between bits of the same weight associated with different x-QAM cells ($x=2^m$). What is more, the algorithm has also been used to generate the internal matrix of the FOCTC turbo-coder 8 integrated into the digital transmission system.

The transmission system 6 is of multicarrier type and defined in the 2-3 GHz band. The spectrum channelization is 5 MHz and the band occupied by the sub-carriers is 3.456 MHz. This configuration is similar to assigning three DECT carriers for transmission, which is also close to that of the UMTS.

The multipath channel models considered for simulating the system correspond to the channel models validated by the ITU-R (International Telecommunication Union-Radio Study Groups) 'Guidelines for Evaluation of Radio Transmission Technologies for IMT-2000/FPLMTS', FPLMTS.REVAL, Question ITU-R, Document 8/29-E, 10 Jun. 1996, for simulating an urban-type environment. The example corresponds to a microcellular deployment situation where radio-frequency coverage does not exceed 500 m. This channel model is known as the 'Vehicular A' tapped delay line channel model.

The OFDM parameters are adjusted as a function of the characteristics of the propagation channel 9 and of a loss of spectral efficiency introduced by the guard interval $\Delta ef=0.34$ dB. These values take account of the 'Pedestrian B' and 'Vehicular A' channel models for the size of the guard interval $T_{CP}$ ($T_{CP} > \tau_{max}$) with $\tau_{max}$ representing the temporal excursion of the delays of the average power profile of the propagation channel. Table 5 in Appendix 3 gives the OFDM parameters associated with the transmission system 6 and the characteristics of the FOCTC turbo-coder 8.

The matrix internal to the turbo-coder 8 is generated so that the data items are interleaved in accordance with the interleaving method of the invention. The pattern generated has a size of 20 which is a multiple of 5 equal to the constraint length of the recursive convolutional basic code. The pattern complies with the constraint imposed by the FOCTC codes for which a '0' coder state at the end of the trellis imposes a basic pattern equal to 5. The interleaving spreading is equal to 601, the value of q is equal to 2, and the pseudoperiod is equal to $L(20,2)=2$.

Second interleaving 10 by the method of the invention is effected on the data items di coded before binary to symbol coding. In this context the invention corrects error bursts associated with fast fading of the propagation channel 9 and ensures a maximum average interleaving spreading between bits of the same weight of 64-QAM cells and successive bits of the coded bit stream. The interleaving size, i.e. the interleaving block size K, is adjusted for a Doppler excursion of 206 Hz that corresponds to a spatial window of one wavelength, i.e. of approximately 97 OFDM symbols, i.e. of 103 680 coded bits.

Geometrical optimization of interleaving is based on seeking an average maximum interleaving spreading between bits of the same weight and between bits of different weights in a 64-QAM cell. Given the pseudoperiodic structure of the interleaving law, this amounts to defining p and q such that the window L during which the difference between bits is constant is of the form $L=6n+3$. This condition ensures maximum interleaving spreading between bits of exactly the same weight.

Table 6 in Appendix 3 gives the interleaving spreading obtained for different values of p that are multiples of the size of the pattern to be reserved, which is 6 (this 6 comes from $2^6$, the size 64-QAM cells) According to this table, Modes 2 and 4 are the optimum relative to mapping. Performance in terms of BER is improved by around 1.5 dB compared to the RP algorithm when the number of branches is of the form $6n+3$ for Modes 2 and 4 in this table.

The invention applies equally well to multicarrier transmission systems and to single-carrier transmission systems provided that the data is packetized. For cellular radio communication systems, and all systems based on a WPAN, WLAN or WMAN-type network architecture, the invention can be used to mix inter-user data and intra-user data before transmission over the physical medium.

One application field that can prove particularly beneficial is that in which the carrier frequency implies a high wavelength (metric, decametric, etc.) that is not well suited to the deployment of a MIMO-type multichannel system. The multidimensional structure of the interleaving algorithm of the invention enables introduction of a virtual multichannel system without a bulky real structure for ensure decorrelation between the individual sources (the spacing between antennas must be greater than $\lambda/2$). This can apply equally well to mobile terminals, which are required to be small, and fixed structures requiring a high wavelength for transmission over long distances (ionospheric radio broadcasting applications).

The invention can be used in the following situations in particular to address specific constraints.

A first particular use of the invention is its application to FOCTC turbo-coders for a block size K. Interleaving in accordance with the invention addresses constraints associated with this type of coder that impose I(k)−k=A(k)*M, where M is the constraint length of the recursive convolutional type base code forming the structure of the turbo-code and A(k) is a series of integers such that A(k)*M<K−1 regardless of the index k, k={0, . . . K−1} and K is the block size to be interleaved.

A second particular use of the invention is its application to overall optimization of a transmission system combining two block interleavers, one 'short' and the other 'long'. Interleaving in accordance with the invention has the advantage for the long interleaver of preserving the interleaving law of the short interleaver; it suffices to make p equal to the depth of the short interleaver.

A third particular use of the invention is its application to correcting correlation introduced by the transmission medium and reflected in a number of data items correlated over an observation window T. The channel correlation can be based on a channel estimate produced by one of the reception modules. Knowing the number of correlated data items enables a target interleaving spreading to be determined. Adjusting the parameters of the interleaving algorithm of the invention produces an interleaving spreading at least equal to the target interleaving spreading.

A fourth particular use of the invention is its application to conjoint optimization of binary interleaving and binary to symbol coding for modulating signals to be transmitted. Optimizing binary to symbol coding exploits the 2D structure of the algorithm to increase the interleaving spreading between two equally weighted bits before binary to symbol coding and the interleaving spreading between bits within each symbol.

A fifth particular use of the invention is its application to conjoint optimization of performance in the physical layer and framing of data in the transmission protocol layer in order to reduce interuser interference.

Interleaving according to the invention preserves an initial pattern of distribution of data items of size p similar to multiplexing p data streams. Moreover, the interleaving spreading between two successive data items or between two successive data items of the same stream can be calculated by an algebraic function. This property can be used to improve conjointly the performance of the MAC layer and the performance of the physical layer.

Control of the interleaving procedure in terms of interleaving spreading and data multiplexing before transmitting data over the physical medium is fundamental to optimize performance not only at the physical layer of the system but also at the MAC layer. Improvements are reflected in a reduction in the power necessary to provide bandwidth in a given (radio or cable) technology or a radio coverage extension of the system associated with a quality of service for a fixed transmitted power. For example, the invention adjusts and optimizes interleaving as a function of the distribution of users in a frame for packet mode transmission. The invention conjointly optimizes capacity and performance on the transmission medium.

APPENDIX 1

TABLE 1 interleaving law for the RP technique with K = 60 and p = 23, calculation of R'.

| k | I (k) | R' (k) |
|---|---|---|
| 0 | 0 | 0 |
| 1 | 23 | 7.33 |
| 2 | 46 | 14.7 |
| 3 | 9 | 2 |
| 4 | 32 | 9.33 |
| 5 | 55 | 16.7 |
| 6 | 18 | 4 |
| 7 | 41 | 11.3 |
| 8 | 4 | −1.33 |
| 9 | 27 | 6 |
| 10 | 50 | 13.3 |
| 11 | 13 | 0.67 |
| 12 | 36 | 8 |
| 13 | 59 | 15.3 |
| 14 | 22 | 2.67 |
| 15 | 45 | 10 |
| 16 | 8 | −2.67 |
| 17 | 31 | 4.67 |
| 18 | 54 | 12 |
| 19 | 17 | −0.67 |
| 20 | 40 | 6.67 |
| 21 | 3 | −6 |
| 22 | 26 | 1.33 |
| 23 | 49 | 8.67 |
| 24 | 12 | −4 |
| 25 | 35 | 3.33 |
| 26 | 58 | 10.7 |
| 27 | 21 | −2 |
| 28 | 44 | 5.33 |
| 29 | 7 | −7.33 |
| 30 | 30 | 0 |
| 31 | 53 | 7.33 |
| 32 | 16 | −5.33 |
| 33 | 39 | 2 |
| 34 | 2 | −10.7 |
| 35 | 25 | −3.33 |
| 36 | 48 | 4 |
| 37 | 11 | −8.67 |
| 38 | 34 | −1.33 |
| 39 | 57 | 6 |
| 40 | 20 | −6.67 |
| 41 | 43 | 0.67 |
| 42 | 6 | −12 |
| 43 | 29 | −4.67 |
| 44 | 52 | 2.67 |
| 45 | 15 | −10 |
| 46 | 38 | −2.67 |
| 47 | 1 | −15.3 |
| 48 | 24 | −8 |
| 49 | 47 | −0.67 |
| 50 | 10 | −13.3 |
| 51 | 33 | −6 |
| 52 | 56 | 1.33 |
| 53 | 19 | −11.3 |
| 54 | 42 | −4 |
| 55 | 5 | −16.7 |
| 56 | 28 | −9.33 |
| 57 | 51 | −2 |
| 58 | 14 | −14.7 |
| 59 | 37 | −7.33 |

APPENDIX 2

TABLE 2

Interleaving spreading of interleaved data

| | | | 64-QAM | 16-QAM |
|---|---|---|---|---|
| | $\Delta_{eff}I^{(j)}$ (s = 1) | $L^{(j)}$ (k) | $\Delta_{eff}I^{(j)}$ (k, s = 6) | $\Delta_{eff}I^{(j)}$ (k, s = 4) |
| Iteration 1 | 23 | 3 | 18 | 28 |
| Iteration 2 | 11 | 5 | 6 | 16 |
| Iteration 3 | 13 | 5 | 18 | 18 |

TABLE 3

Interleaving spreading for different values of p, q = 2 and 64-QAM modulation

| | | | $\Delta_{eff}I^{(j)}$ (s = 1) | | | L (s = 1) | | | $\Delta_{eff}I^{(j)}$ (k, s = 6) | | |
|---|---|---|---|---|---|---|---|---|---|---|---|
| K | p | K/p | It. 1 | It. 2 | It. 3 | It. 1 | It. 2 | It. 3 | It. 1 | It. 2 | It. 3 |
| 60 | 3 | 20 | 23 | 11 | 13 | 3 | 5 | 5 | 18 | 6 | 18 |
| 60 | 6 | 10 | 23 | 25 | 11 | 3 | 2 | 5 | 18 | 30 | 6 |
| 60 | 12 | 5 | 11 | 25 | 23 | 5 | 2 | 3 | 6 | 30 | 18 |
| 60 | 15 | 4 | 1 | 1 | 1 | 60 | 60 | 60 | 6 | 6 | 6 |
| 60 | 20 | 3 | 1 | 1 | 1 | 60 | 60 | 60 | 6 | 6 | 6 |

TABLE 4

Interleaving spreading for different values of p, q = 2 and 16-QAM modulation

| | | | $\Delta_{eff}I^{(j)}$ (s = 1) | | | L (s = 1) | | | $\Delta_{eff}I^{(j)}$ (k, s = 4) | | |
|---|---|---|---|---|---|---|---|---|---|---|---|
| K | p | K/p | It. 1 | It. 2 | It. 3 | It. 1 | It. 2 | It. 3 | It. 1 | It. 2 | It. 3 |
| 60 | 3 | 20 | 23 | 11 | 13 | 3 | 5 | 5 | 28 | 16 | 8 |
| 60 | 6 | 10 | 23 | 25 | 11 | 3 | 2 | 5 | 28 | 20 | 16 |
| 60 | 12 | 5 | 11 | 25 | 23 | 5 | 2 | 3 | 16 | 20 | 28 |
| 60 | 15 | 4 | 1 | 1 | 1 | 60 | 60 | 60 | 4 | 4 | 4 |
| 60 | 20 | 3 | 1 | 1 | 1 | 60 | 60 | 60 | 4 | 4 | 4 |
| 60 | 30 | 2 | 1 | 1 | 1 | 60 | 60 | 60 | 4 | 4 | 4 |

APPENDIX 3

TABLE 5

OFDM parameters associated with the transmission system

| OFDM parameters and coding | Value |
|---|---|
| $N_{pm}$: Number of sub-carriers | 177 |
| $\Delta F$: sub-carrier spacing | 19.5 kHz |
| $N_{FFT}$: IFFT/FFT | 256 |
| $T_{CP}$: cyclic prefix duration/guard | 4.2 µs |
| $T_{FFT}$: useful OFDM symbol time duration/FFT period | 51.2 µs |
| $T_{SYM}$: OFDM symbol total duration | 55.4 µs ($T_{CP} + T_{FFT}$) |
| Fe: sampling rate | 5 MHz |
| FOCTC coding, code rate r = 1/3 | RSC elementary code generator polynomials (25 bytes, 37 bytes) |
| FOCTC internal interleaving matrix parameters | Invention with p = 20, q = 2, $K_{int}$ = 1440, iteration 1 |

TABLE 6

Interleaving pattern parameters

| | p | $\Delta I_{eff}$ (s = 1) | $\Delta I_{eff}$ (s = L) | No. of branches L | $\Delta I_{eff}$ (s = 6) |
|---|---|---|---|---|---|
| Mode 1 | 6 × 1440 = 8640 | 17279 | 6 | 6 | 6 |
| Mode 2 | 240 | 11999 | 4311 | 9 | 71294 |
| Mode 3 | 1440 | 2879 | 36 | 36 | 17274 |
| Mode 4 | 36 | 2663 | 177 | 39 | 15978 |
| RP | 17279 | 173279 | | | |

The invention claimed is:

1. A block interleaving method with a block size K and with N iterations of index j, N being greater than or equal to 1, for use with digital data items indexed by a variable k={0, . . . , K−1} in a block interleaver for positioning input digital data items X in an output sequence made up of output digital data items Y in an order determined by an interleaving law $I^{(j)}(k)$ such that $Y(k)=X(I^{(j)}(k))$, wherein the method comprises the steps of:

calculating an intermediate value $I_0^{(j)}(k)$ of the interleaving law that for a first iteration (j=1) is a result of applying a first algebraic function $f_0(a, b)$ modulo K with two variables a and b to input indices k, with a=b=k such that $f_0(a, b)=[-a-pb]_K$, wherein for the intermediate value from the first iteration: $I_0^{(1)}(k)=[-k-pk]_K$ and for each subsequent iteration j, j=2 to N, is the result of applying the first algebraic function $f_0(a, b)$ to the input indices k and to an output value $I^{(j-1)}(k)$ obtained during the preceding iteration: $I_0^{(j)}(k)=[-k-p \cdot I^{(j-1)}(k)]_K$;

calculating the output value $I^{(j)}(k)$ of the interleaving law that, for a given iteration j, is the result of applying a second algebraic function $f_1(a, b)$ modulo K with two variables a and b to the input indices k and to the intermediate value $I_0^{(j)}(k)$ calculated in the same iteration j, with a=k and b=$I_0^{(j)}(k)$ such that $f_1(a, b)=[\alpha p+a+qpb]_K$, wherein for the output value $I^{(j)}(k)$ after each iteration j: $I^{(j)}(k)=[\alpha p+k+q \cdot p \cdot I_0^{(j)}(k)]_K$, where p and q are natural integer parameters and $[X]_K$ signifies X modulo K; and positioning the input digital data items X, using the block interleaver, in the output sequence made up of the output digital data items Y in the order determined by the interleaving law $I^{(j)}(k)$ and outputting the output digital data items Y from the block interleaver as a bit stream for modulation.

2. The block interleaving method with said block size K and with said N iterations of index j according to claim 1, wherein α is equal to K/p−1.

3. The block interleaving method with said block size K and with said N iterations of index j according to claim 1, wherein p depends on the size of a pattern to be preserved determined by an external constraint.

4. The block interleaving method with said block size K and with said N iterations of index j according claim 3, wherein the external constraint takes account of a distribution of the bits in data symbols resulting from symbol binary coding.

5. The block interleaving method with said block size K and with said N iterations of index j according to claim 1, for a given iteration j, the method further including:

calculating a difference after interleaving between two input digital data items X(k) and X(k+s) separated by s−1 data items, said difference being determined by iteratively calculated equation $P_{j,s}(k)=I^{(j)}(k+s)-I^{(j)}(k)=[s-q \cdot p \cdot (s+p \cdot P_{j-1,s}(k))]_k$, where s is strictly less than K, $P_{1,s}(k)=[s-q\cdot p\cdot s(1+p)]_k$, where q is a natural integer parameter and $[X]_K$ signifies X modulo K.

6. The block interleaving method with said block size K and with said N iterations of index j according to claim 5, the method further comprising determining an interleaving spreading value $\Delta_{\mathit{eff}}I^{(j)}(s)$ from the difference $P_{j,s}(k)=I^{(j)}(k+s)-I^{(j)}(k)$ with an equation $\Delta_{\mathit{eff}}I^{(j)}(s)=\text{Min}\{|P_{j,s}(k)|, K-|P_{j,s}(k)|\}$ for at least one particular value of s greater than or equal to one, and the selected iteration j is such that after that iteration j each interleaving spreading $\Delta_{\mathit{eff}}I^{(j)}(s)$ is greater than or equal to a particular value.

7. A non-transitory information medium including program instructions adapted to execute a block interleaving method (1) with said block size K and with said N iterations of index j, N being greater than or equal to 1, for use with digital data items indexed by a variable $k=\{0, \ldots, K-1\}$ according to claim 1 when said program is loaded into and executed by an electronic device.

8. A block interleaving method with a block size K and with N iterations of index j greater than or equal to 1 for use with digital data items indexed by a variable $k=\{0, \ldots, K-1\}$, the method comprising interleaving a block of input digital data items X, using a block interleaver to produce an output sequence of output digital data items Y, according to a determined law I(k)

$$I^{(1)}(k)=[\alpha p+k+p\cdot q\cdot [-k-k\cdot p]_K]_K; \text{ and}$$

$$I^{(j)}(k)=[\alpha p+k+p\cdot q\cdot [-k-p\cdot I^{(j-1)}(k)]_K]_K$$

where p and q are determined natural integer parameters and α is a natural integer parameter between zero and K/p, such that the output digital data items Y are in the order determined by the interleaving law: $Y(k)=X(I^{(j)}(k))$.

9. The block interleaving method with said block size K and with said N iterations of index j according to claim 8, wherein α is equal to K/p-1.

10. The block interleaving method with said block size K and with said N iterations of index j according to claim 8, wherein p depends on the size of a pattern to be preserved determined by an external constraint.

11. The block interleaving method with said block size K and with said N iterations of index j according claim 10, wherein the external constraint takes account of a distribution of the bits in data symbols resulting from symbol binary coding.

12. The block interleaving method with said block size K and with said N iterations of index j according to claim 8, for a given iteration j the method further comprising:
calculating a difference after interleaving between two input digital data items X(k) and X(k+s) separated by s-1 data items, said difference being determined by iteratively calculated equation $P_{j,s}(k)=I^{(j)}(k+s)-I^{(j)}(k)=[s-q\cdot p\cdot(s+p\cdot P_{j-1,s}(k))]_K$, where s is strictly less than K, $P_{1,s}(k)=[s-q\cdot p\cdot s(1+p)]_K$, where q is a natural integer parameter and $[X]_K$ signifies X modulo K.

13. The block interleaving method with said block size K and with said N iterations of index j according to claim 12, the method further comprising determining an interleaving spreading value $\Delta_{\mathit{eff}}I^{(j)}(s)$ from the difference $P_{j,s}(k)=I^{(j)}(k+s)-I^{(j)}(k)$ by means of equation $\Delta_{\mathit{eff}}I^{(j)}(s)=\text{Min }\{|P_{j,s}(k)|, K-|P_{j,s}(k)|\}$ for at least one particular value of s greater than or equal to one and the selected iteration j is such that after that iteration j each interleaving spreading $\Delta_{\mathit{eff}}I^{(j)}(s)$ is greater than or equal to a particular value.

14. A non-transitory information medium including program instructions adapted to execute a block interleaving method with said block size K and with said N iterations of index j, N being greater than or equal to 1, for use with digital data items indexed by a variable $k=\{0, \ldots, K-1\}$ according to claim 8, wherein said program is loaded into and executed in an electronic device.

15. A block interleaving device with a block size K and with an interconnected iterative structure of N cells of index j where N is greater than or equal to 1 for use with digital data items indexed by a variable $k=\{0, \ldots, K-1\}$, said block interleaving device comprising:
N basic cells I, each basic cell comprising two inputs and one output, wherein each basic cell I is formed of two individual cells $I_0$ and $I_1$, each of the individual cells comprising two inputs and one output, the output of the basic cell I corresponding to the output of the individual cell $I_1$, the two inputs of the basic cell I corresponding to the two inputs of the individual cell $I_0$, the output of the individual cell $I_0$ corresponding to a first input of the individual cell $I_1$,
wherein the second input of the individual cell $I_1$ is connected to a first input of the individual cell $I_0$ that corresponds to a first input of the basic cell I, the two inputs of the first basic cell I are linked to each other and correspond to the index k, the output of each basic cell I is connected to the second input of the basic cell I of the next iteration, and the first inputs of the basic cells I are linked to each other,
wherein each individual cell $I_0$, $I_1$, includes a calculator for performing a calculation based on the inputs of the individual cells $I_0$ and $I_1$, and
wherein the block interleaving device is configured to interleave a block of input digital data items X to produce an output sequence of output digital data items Y, according to a determined law I(k)

$$I^{(1)}(k)=[\alpha p+k+p\cdot q\cdot [-k-k\cdot p]_K]_K; \text{ and}$$

$$I^{(j)}(k)=[\alpha p+k+p\cdot q\cdot [-k-p\cdot I^{(j-1)}(k)]_K]_K$$

where p and q are determined natural integer parameters and α is a natural integer parameter between zero and K/p, such that the output digital data items Y are in the order determined by the interleaving law: $Y(k)=X(I^{(j)}(k))$.

16. The block interleaving device with said block size K and with said N iterations of index j according to claim 15, wherein the calculation performed by the calculator of each individual cell $I_0$, $I_1$, is an algebraic function modulo K with two variables a and b that respectively correspond to each of the inputs of the individual cell $I_0$, $I_1$.

17. A block interleaving device with a block size K for use with digital data items indexed by a variable $k=\{0, \ldots, K-1\}$, the interleaving device comprising an interleaver with an interconnected iterative structure of N cells of index j, where N is greater than or equal to 1, for interleaving a block of input digital data items X to produce an output sequence of output digital data items Y, according to a determined law I(k)

$$I^{(1)}(k)=[\alpha p+k+p\cdot q\cdot [-k-k\cdot p]_K]_K; \text{ and}$$

$$I^{(j)}(k)=[\alpha p+k+p\cdot q\cdot [-k-p\cdot I^{(j-1)}(k)]_K]_K$$

where p and q are determined natural integer parameters and α is a natural integer parameter between zero and K/p, such that the output digital data items Y are in the order determined by the interleaving law: $Y(k)=X(I^{(j)}(k))$.

18. The block interleaving device according to claim 17, wherein α is equal to K/p-1.

19. A block interleaving device, having an interconnected iterative structure of cells, with a block size K for interleaving a block of K input digital data items X indexed by a variable k, k={0, ..., K−1}, with a determined interleaving law I(k), with determined natural integer parameters p and q for a given interleaving spreading, the block interleaving device comprising a turbo structure of J iterations of a basic cell I indexed j each composed of a basic turbo structure of two elementary cells $I_0$, $I_1$ including a calculator adapted to calculate respectively a first algebraic function $f_0$ modulo K, $I_0^{(j)}(k) = f_0(k, I^{(j-1)}(k)) = [-k - p I^{(j-1)}(k)]_K$ with the initial condition that at first iteration both arguments are equal to k, and a second algebraic function $f_1$ modulo K $I_1^{(j)}(k) = f_1(k, I_0^{(j)}(k)) = [K - p + k + q \cdot p \cdot k_2]_K$, the interleaving law being the output of the Jth basic cell $I(k) = I^{(j)}(k) = I_1^{(j)}(k)$, such that the output digital data items Y are in the order determined by the interleaving law: $Y(k) = X(I^{(j)}(k))$.

* * * * *